(12) United States Patent
Weng et al.

(10) Patent No.: US 11,223,015 B1
(45) Date of Patent: Jan. 11, 2022

(54) METHOD OF MANUFACTURING DISPLAY PANEL AND METHOD OF MANUFACTURING FUNCTIONAL LAYER THEREOF

(71) Applicant: WUHAN CHINA STAR OPTOELECTRONICS SEMICONDUCTOR DISPLAY TECHNOLOGY CO., LTD., Hubei (CN)

(72) Inventors: Dezhi Weng, Hubei (CN); Gaozhen Wang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 213 days.

(21) Appl. No.: 16/641,585

(22) PCT Filed: Nov. 15, 2019

(86) PCT No.: PCT/CN2019/118978
§ 371 (c)(1),
(2) Date: Feb. 24, 2020

(87) PCT Pub. No.: WO2021/031414
PCT Pub. Date: Feb. 25, 2021

(30) Foreign Application Priority Data

Aug. 20, 2019 (CN) .......................... 201910766918.X

(51) Int. Cl.
*H01L 51/00* (2006.01)
*H01L 27/32* (2006.01)
*H01L 51/50* (2006.01)

(52) U.S. Cl.
CPC ...... *H01L 51/0005* (2013.01); *H01L 27/3211* (2013.01); *H01L 27/3262* (2013.01);
(Continued)

(58) Field of Classification Search
CPC ............. H01L 51/0005; H01L 27/3211; H01L 51/0007
See application file for complete search history.

(56) References Cited

U.S. PATENT DOCUMENTS

2005/0260335 A1 11/2005 Kimura et al.
2007/0052119 A1 3/2007 Sakai et al.
(Continued)

FOREIGN PATENT DOCUMENTS

CN 1700044 A 11/2005
CN 1943879 A 4/2007
(Continued)

*Primary Examiner* — Anthony Ho

(57) ABSTRACT

The disclosure provides a method of manufacturing a display panel and a method of manufacturing a functional layer thereof. The method of manufacturing the functional layer includes following steps: forming an ink layer on a display area of a substrate by inkjet printing, wherein the ink layer includes a solute and a solvent configured to dissolve the solute, different positions of the ink layer have same amount of the solute, and an amount of the solvent in a periphery of the ink layer is greater than an amount of the solvent in a middle portion of the ink layer; and evaporating the solvent in the ink layer to form the functional layer with uniform thickness.

17 Claims, 4 Drawing Sheets

(52) U.S. Cl.
CPC ...... *H01L 51/0007* (2013.01); *H01L 51/5056* (2013.01); *H01L 2251/558* (2013.01)

(56) References Cited

U.S. PATENT DOCUMENTS

| | | |
|---|---|---|
| 2009/0191326 A1 | 7/2009 | Ishizuka et al. |
| 2017/0036461 A1 | 2/2017 | Hu et al. |
| 2019/0229298 A1* | 7/2019 | Shi ..................... H01L 51/5012 |
| 2020/0066989 A1 | 2/2020 | Cui et al. |

FOREIGN PATENT DOCUMENTS

| | | |
|---|---|---|
| CN | 101498856 A | 8/2009 |
| CN | 104786656 A | 7/2015 |
| CN | 108281474 A | 7/2018 |

* cited by examiner

METHOD OF MANUFACTURING DISPLAY PANEL AND METHOD OF MANUFACTURING FUNCTIONAL LAYER THEREOF

FIELD

The present disclosure relates to the field of display panel technologies, and more particularly, relates to a method of manufacturing a display panel and a method of manufacturing a functional layer thereof.

BACKGROUND

Background information mentioned below is not necessarily regarded as prior art.

Currently, organic light-emitting diodes (OLEDs) manufactured by inkjet printing have advantages such as simple operation, low cost, simple process, and easy realization of large scale. Active materials, such as a solution of hole injection layer (HIL), a solution of hole transport layer (HTL), and solutions of red, green, and blue luminescent materials, are separately printed in a sub-pixel (luminescent area) of a patterned substrate by a micro-level printhead to form red, green, and blue light-emitting units, and thicknesses of layers are decided according to an amount of a solute printed in the sub-pixel.

However, a solute for inkjet printing must be dissolved in a solvent before being printed on a substrate. Afterwards, the solvent in a solution is evaporated by an evaporation process to form a film. During a printing process, the solution is printed on a display area of the substrate by a printhead. After the printing process, the solvent on the substrate is evaporated. In an evaporation process, the shorter a distance between a middle portion of the substrate and a location where a solvent gas is volatilized, the higher a concentration of the solvent gas, and the closer the solvent gas is to saturation. Therefore, the solution under the middle portion of the display area is not easily dried. Meanwhile, the shorter a distance between a periphery of the substrate and a location where the solvent gas is volatilized, the lower the concentration of the solvent gas, and the easier the solvent gas is volatilized. Apparently, a volatilization speed of the solvent in the middle portion of the display area and a volatilization speed of the solvent in the periphery of the display area are significantly different, resulting in a layer with non-uniform thickness on the display area, thereby affecting uniformity of a thickness of an entire film and severely affecting luminescence performance of an OLED device.

In conventional technology, to solve the above problem of non-uniform film thickness and unsatisfactory display performance in the display area, a virtual pixel layer is formed around the display area, and the solution is also printed on the virtual pixel layer during inkjet printing so that a saturation area of the solution on the virtual pixel layer is properly extended, thereby ensuring that a concentration of the solvent gas in the middle portion of the display area and a concentration of the solvent gas in the periphery of the display area can be even during the evaporation process after the substrate is printed. However, the virtual pixel layer cannot display, and a location where the virtual pixel layer is disposed cannot be encapsulated, which affects encapsulation effect. As a result, an encapsulation area needs to be disposed around the virtual pixel layer, thereby increasing a frame thickness. Therefore, a narrow frame is hard to be realized.

Consequently, it is necessary to provide a method that can effectively solve a problem of non-uniform film in the display area due to uneven concentration of the solvent gas above the display area of the substrate in a solvent vaporization process during inkjet printing and can simultaneously realize narrow-frame OLED devices.

SUMMARY

The present disclosure provides a method of manufacturing a display panel and a method of manufacturing a functional layer thereof. An amount of a solvent printed on different positions of an ink layer on a display area of a substrate is controlled. Specifically, an amount of the solvent printed on a periphery of the ink layer is greater than an amount of the solvent printed on a middle portion of the ink layer, thereby solving a problem of non-uniform film in the display area because of uneven concentration of the solvent gas above the display area of the substrate in a solvent vaporization process during inkjet printing. Furthermore, a virtual pixel layer around the display area can be omitted, thereby realizing a narrow-frame display panel.

To solve the above problem, technical solutions provided by the present disclosure are described below.

The present disclosure provides a method of manufacturing a functional layer of a display panel having a substrate, including following steps:

forming an ink layer on a display area of the substrate by inkjet printing, wherein the ink layer includes a solute and a solvent configured to dissolve the solute, different positions of the ink layer have same amount of the solute, and an amount of the solvent in a periphery of the ink layer is greater than an amount of the solvent in a middle portion of the ink layer; and evaporating the solvent in the ink layer to form the functional layer with a uniform thickness.

In the method provided by an embodiment of the present disclosure, in a direction from the middle portion of the ink layer to the periphery of the ink layer, an amount of the solvent continuously increases.

In the method provided by an embodiment of the present disclosure, the ink layer includes a middle area, different positions of the middle area have same amount of the solute, and an amount of the solvent continuously increases in a direction from the middle area to the periphery of the ink layer.

In the method provided by an embodiment of the present disclosure, the solvent includes a first solvent and a second solvent, and the ink layer is formed on the display area of the substrate by inkjet printing. The method includes following steps:

printing the first solvent having a solute on the display area of the substrate by inkjet printing; and printing the second solvent on the first solvent having the solute by inkjet printing to form the ink layer, wherein different positions of the ink layer have same amount of the first solvent, and an amount of the second solvent in the periphery of the ink layer is greater than an amount of the second solvent in the middle portion of the ink layer.

In the method provided by an embodiment of the present disclosure, a material of the first solvent and a material of the second solvent are same.

In the method provided by an embodiment of the present disclosure, an amount of the solvent continuously increases in a direction from the middle portion of the ink layer to the periphery of the ink layer.

In the method provided by an embodiment of the present disclosure, the ink layer includes a middle area, and an amount of the second solvent continuously increases in a direction from the middle area to the periphery of the ink layer.

In the method provided by an embodiment of the present disclosure, the functional layer includes a hole injection layer, a hole transport layer, or a luminescent layer.

In the method provided by an embodiment of the present disclosure, the display area of the substrate includes a plurality of sub-pixel areas arranged in an array, the ink layer is formed in the sub-pixel areas, the sub-pixel areas have same amount of the solute per unit area, and an amount of the solute per unit area of the sub-pixel areas near the periphery of the display area is greater than an amount of the solute per unit area of the sub-pixel areas near the middle portion of the display area.

In the method provided by an embodiment of the present disclosure, the substrate includes a base plate, a thin film transistor (TFT) array layer disposed on the base plate, a plurality of anodes spaced apart from each other on the TFT array layer, and a pixel defining layer disposed around the anodes; and wherein the anodes are disposed in the display area, and the pixel defining layer is disposed around the anodes to form the sub-pixel areas.

In the method provided by an embodiment of the present disclosure, the sub-pixel areas include a red sub-pixel area, a green sub-pixel area, and a blue sub-pixel area.

The present disclosure further provides a method of manufacturing a functional layer of a display panel having a substrate, including following steps:

printing a first solvent having a solute on a display area of the substrate by inkjet printing;

printing the second solvent on the first solvent having the solute by inkjet printing to form an ink layer, wherein different positions of the ink layer have same amount of the first solvent, and an amount of the second solvent in a periphery of the ink layer is greater than an amount of the second solvent in a middle portion of the ink layer; and evaporating the first solvent and the second solvent in the ink layer to form the functional layer with uniform thickness.

An embodiment of the present disclosure further provides a method of manufacturing a display panel, including following steps:

providing a substrate; and forming a plurality of functional layers stacked on the substrate by the above method of manufacturing the functional layer of the display panel, wherein the functional layers include a hole injection layer, a hole transport layer, or a luminescent layer.

In the method provided by an embodiment of the present disclosure, an amount of the solvent continuously increases in a direction from the middle portion of the ink layer to the periphery of the ink layer.

In the method provided by an embodiment of the present disclosure, the ink layer includes a middle area, different positions of the middle area have same amount of the solute, and an amount of the solvent continuously increases in a direction from the middle area to the periphery of the ink layer.

In the method provided by an embodiment of the present disclosure, the display area of the substrate includes a plurality of sub-pixel areas arranged in an array, and the functional layers are formed in each of the sub-pixel areas.

In the method provided by an embodiment of the present disclosure, the substrate includes a base plate, a thin film transistor (TFT) array layer disposed on the base plate, a plurality of anodes spaced apart from each other on the TFT array layer, and a pixel defining layer disposed around the anodes; and wherein the anodes are disposed in the display area, and the pixel defining layer is disposed around the anodes to form the sub-pixel areas.

Regarding the beneficial effects: in the present disclosure, in a display area of a substrate of a display panel, an amount of a solute in different positions of an ink layer formed by inkjet printing is same. Furthermore, an amount of a solvent in a periphery of the ink layer is greater than an amount of the solvent in a middle portion of the ink layer. Therefore, when the solvent in the ink layer in the display area is evaporated, a concentration of a gas solvent above an entire display area of the substrate is roughly even so that a volatilization rate of the solvent in the entire ink layer in the substrate is roughly even. Moreover, a situation in which part of the solute dissolved in the solvent is evaporated due to overly high volatilization rate of the solvent in the periphery of the ink layer is prevented. Therefore, a functional layer provided by the present disclosure can have uniform thickness. In addition, in a situation that the concentration of the gas solvent above the entire display area of the substrate is roughly even, a virtual pixel layer that cannot display can be omitted. As a result, not only does the functional layer have uniform thickness, but a display panel having a narrow frame can also be realized.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
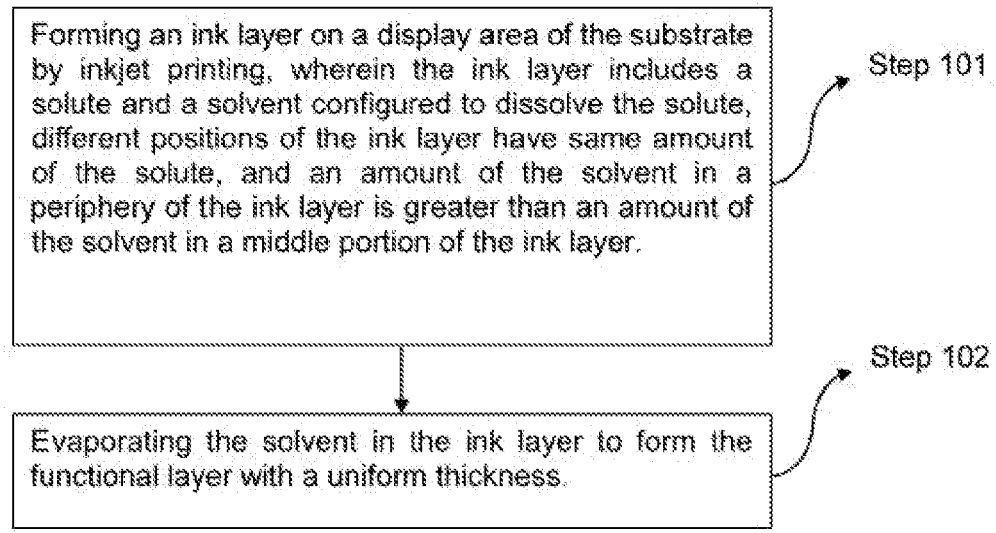
FIG. 1 is a schematic flowchart showing a method of manufacturing a functional layer of a display panel according to an embodiment of the present disclosure.

The specific structures and detail functions disclosed herein are merely representative and are for purposes of describing exemplary embodiments of the present invention. However, the present invention may be embodied in many alternative forms and should not be construed as being limited to the embodiments set forth herein.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified. In addition, terms "including" and "including" and any variants thereof are intended to cover non-exclusive inclusions.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or a direct connection; it can also mean an indirect connection by an intermediate, or an inner communication between two elements. A person skilled in the art should understand the specific meanings in the present disclosure according to specific situations.

Terms used herein are for the purpose of describing the particular embodiments. Unless specified or limited otherwise, the singular forms like "a" used herein are also intended to include the plural. It should be noted that, terms such as "including" and/or "including" used herein are intended to mean the existence of the recited features, integers, steps, operations, units and/or components, and does not exclude the presence or addition of one or more other features, integers, steps, operations, units, components, and/or combinations thereof.

The present disclosure is further described below in conjunction with the accompanying drawings and embodiments.

As shown in FIG. 1 to FIG. 4, an embodiment of the present disclosure provides a method of manufacturing a functional layer of a display panel. A display panel 1 includes a substrate 3, as shown in FIG. 1, and a method of manufacturing a functional layer 2 of the display panel 1 includes following steps:

Step 101: forming an ink layer on a display area of the substrate by inkjet printing, wherein the ink layer includes a solute and a solvent configured to dissolve the solute, different positions of the ink layer have same amount of the solute, and an amount of the solvent in a periphery of the ink layer is greater than an amount of the solvent in a middle portion of the ink layer; and Step 102: evaporating the solvent in the ink layer to form the functional layer with uniform thickness.

Specifically, a bottom area of an ink layer 4, which is an area of an orthographic projection of a side of the ink layer 4 near the substrate 3 on the substrate 3, is a luminescent area of the display panel 1. In all embodiments of the present disclosure, an amount of a solute 5 denotes an amount of the solute 5 per unit of the luminescent area, and an amount of a solvent 6 denotes an amount of the solvent 6 per unit of the luminescent area.

Specifically, the display panel 1 includes an organic electroluminescent display panel, the functional layer 2 includes a hole injection layer, a hole transport layer, or a luminescent layer, and a display area 15 of the substrate 3 corresponds to a display area of the display panel 1.

Figure 2:
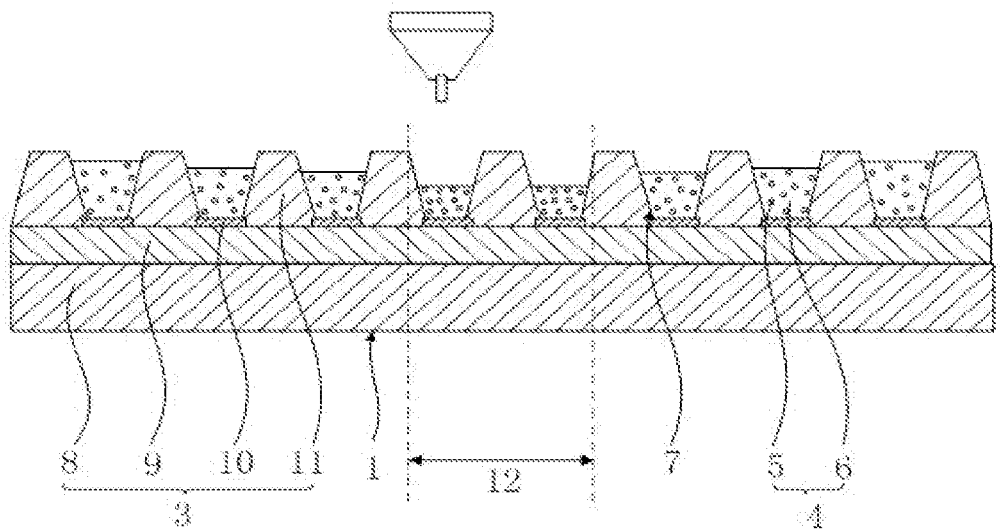
FIG. 2 is a schematic sectional view showing a portion of a structure of a display panel during inkjet printing according to an embodiment of the present disclosure.
Figure 3:
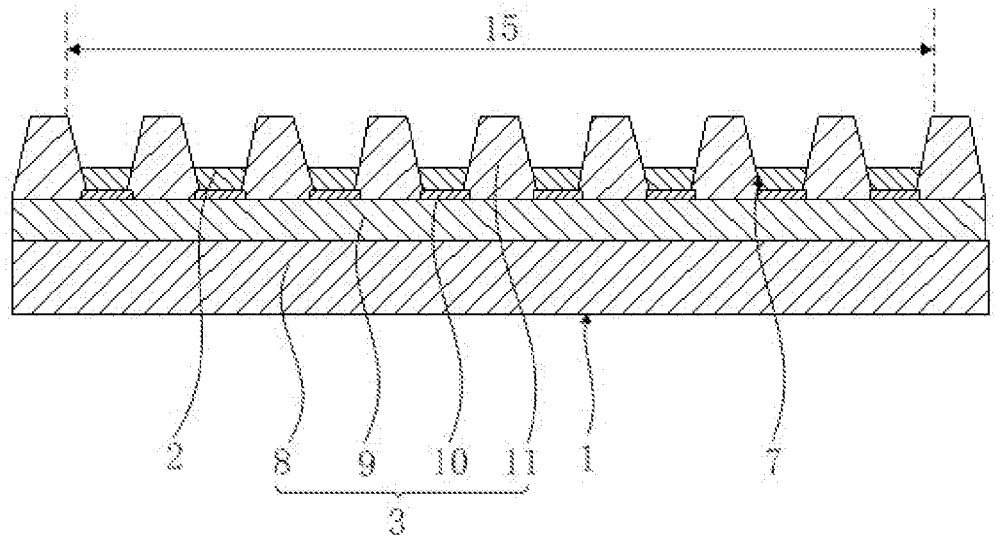
FIG. 3 is a schematic sectional view showing a portion of a structure of a display panel according to an embodiment of the present disclosure.

Specifically, as shown in FIG. 2 and FIG. 3, the display panel 15 of the substrate 3 includes a plurality of sub-pixel areas 7 arranged in an array, the ink layer 4 is formed in the sub-pixel areas 7, and each of the sub-pixel areas 7 has an equal amount of the solute 5 per unit area (each of the sub-pixel areas 7 has an equal amount of the solute 5 per unit of the bottom area, wherein the bottom area is an area of an orthographic projection of sides of the sub-pixel areas 7 near the substrate 3 on the substrate 3, and is a luminescent area of the display panel 1). Furthermore, an amount of the solute 6 per unit area of the sub-pixel areas 7 near a periphery of the display area 15 is greater than an amount of the solute 6 per unit area of the sub-pixel areas 7 near a middle portion of the display area 15.

Specifically, when each of the sub-pixel areas 7 has an equal amount of bottom area, each of the sub-pixel areas 7 has an equal amount of the solute 5; when each of the sub-pixel areas 7 has a different amount of bottom area, a total amount of the solute 5 in different sub-pixel areas 7 are different, while the amount of the solute 5 per unit of the bottom area is same. For example, the sub-pixel areas 7 include a red sub-pixel area, a green sub-pixel area, and a blue sub-pixel area, which correspondingly forms a red sub-pixel, a green sub-pixel, and a blue sub-pixel. Because the above three sub-pixels have different lifetimes and different brightnesses, the above three sub-pixels (sub-pixel areas) have different sizes. Specifically, there are three types of the sub-pixel areas 7 with three different sizes of bottom areas, which form three types of the sub-pixels with three different volumes, wherein the blue sub-pixel has the biggest volume. Each of the sub-pixels is formed from multiple functional layers 2 which are stacked. Therefore, under a condition that thicknesses of films are even, the functional layers 2 formed in the above three sub-pixel areas 7 have different volumes, but have same heights. That is, the above three sub-pixel areas 7 have a different amount of the solute 5, while the amount of the solute 5 per unit of the bottom area is same.

Specifically, as shown in FIG. 2 and FIG. 3, the substrate 3 of the display panel 1 includes a base plate 8, a thin film transistor (TFT) array layer 9 disposed on the base plate 8, a plurality of anodes 10 spaced apart from each other on the TFT array layer 9, and a plurality of pixel defining layers 11 spaced apart from each other on the TFT array layer 9. The anodes 10 are disposed in the display area 15, and the pixel defining layers 11 are disposed around the anodes 10 to form the sub-pixel areas 7.

In the present embodiment, in the display area 15 of the substrate 3 of the display panel 1, an amount of the solute 5 in different positions of the ink layer 4 formed by inkjet printing is same. Furthermore, an amount of the solvent 6 in a periphery of the ink layer 4 is greater than an amount of the solvent 6 in a middle portion of the ink layer 4. Therefore, when the solvent 6 in the ink layer 4 in the display area 15 is evaporated, a concentration of a gas solvent above the entire display area 15 of the substrate 3 is roughly even so that a volatilization rate of the solvent 6 in the entire ink layer 4 of the substrate 3 is roughly even. Moreover, a situation in which the solute 5 dissolved in the solvent 6 is evaporated due to an overly high volatilization rate of the solvent 6 in the periphery of the ink layer 4 is prevented, and the functional layers 2 provided by the present embodiment can have uniform thicknesses. In addition, in a situation that the concentration of the gas solvent above the entire display area 15 of the substrate 3 is roughly even, a virtual pixel layer that cannot display can be omitted, so that it will not be disposed around the display area 15. As a result, not only functional layers with uniform thicknesses but also the display panel 1 having a narrow frame can be realized.

In one embodiment, in a direction from the middle portion of the ink layer 4 to the periphery of the ink layer 4, an amount of the solvent 6 continuously increases. In the present disclosure, an amount of the solvent 6 in different positions of the ink layer 4 depends on a distance between the middle portion of the ink layer 4 and the periphery of the ink layer 4. The greater the distance, the greater the amount of the solvent 6. This allows a volatilization rate of the solvent 6 in different positions of the ink layer 4 to be roughly even during an evaporative drying process, which is beneficial to form the functional layers 2 with uniform thicknesses.

As shown in FIG. 2, an embodiment of the present disclosure further provides a method of manufacturing a functional layer of a display panel. Different from the above embodiment, in the present embodiment, the ink layer 4 includes a middle area 12, an amount of the solvent 6 in different positions of the middle area 12 is same, and an amount of the solvent 6 continuously increases in a direction from the middle area 12 to the periphery of the ink layer 4.

In the present embodiment, a volatilization rate of the solvent 6 in the middle area 12 of the ink layer 4 is roughly even, but is less than a volatilization rate of the solvent 6 in the periphery of the ink layer 4. As a result, the amount of the solvent 6 in different positions of the middle area 12 of the ink layer 4 remains same, while the amount of the solvent 6 continuously increases in the direction from the middle area 12 to the periphery of the ink layer 4. Therefore, a volatilization rate of the solvent 6 continuously decreases in the direction from the middle area 12 to the periphery of the ink layer 4 so that the volatilization rate of the solvent 6 in different positions of the ink layer 4 is roughly even during an evaporative drying process, which is beneficial to form the functional layers 2 with uniform thicknesses.

Figure 5:
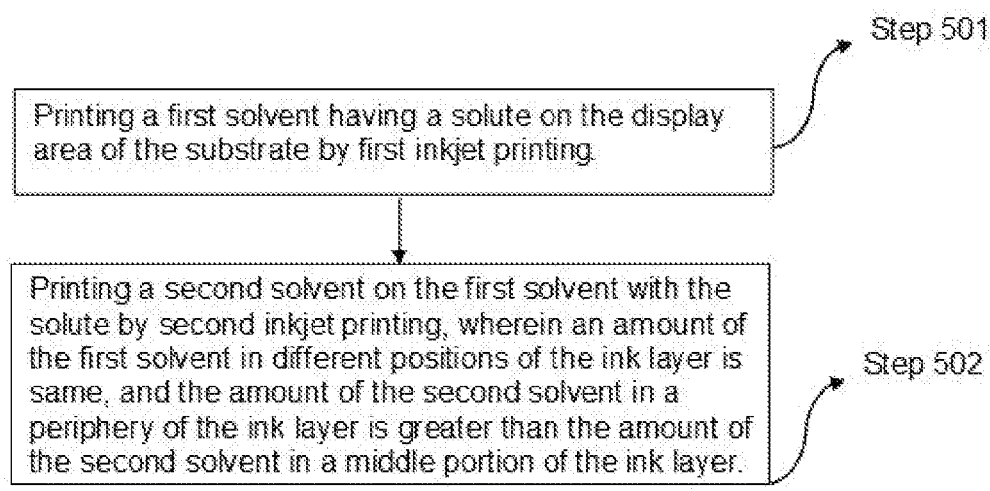
FIG. 5 is a schematic flowchart showing a method of manufacturing a functional layer of another display panel according to an embodiment of the present disclosure.
Figure 6:
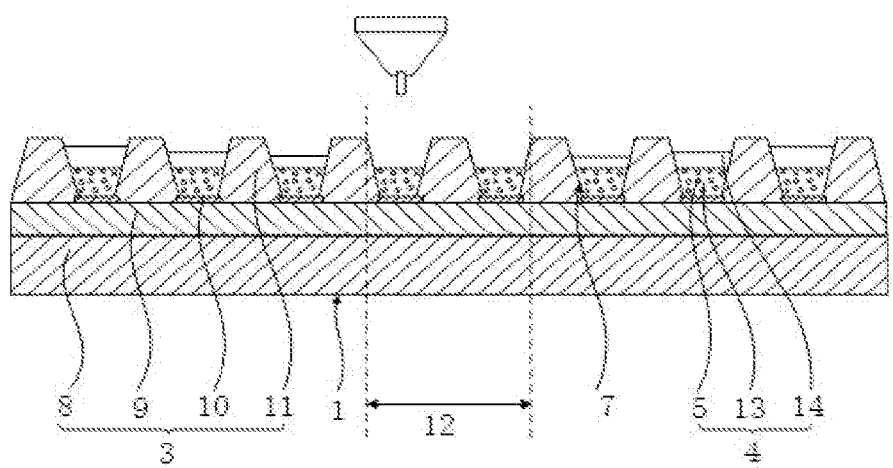
FIG. 6 is a schematic structural view showing a portion of a structure of yet another display panel during inkjet printing according to an embodiment of the present disclosure.

As shown in FIG. 5 and FIG. 6, an embodiment of the present disclosure further provides a method of manufacturing a functional layer of a display panel. Different from the above embodiments, in the present embodiment, the solvent 6 includes a first solvent 13 and a second solvent 14. As shown in FIG. 5, in the Step 101, the ink layer is printed on the display area of the substrate by inkjet printing, and the step 101 further includes following steps:

Step 501: printing a first solvent having a solute on the display area of the substrate by a first inkjet printing process; and Step 502, printing a second solvent on the first solvent with the solute by a second inkjet printing process, wherein an amount of the first solvent in different positions of the ink layer is same, and an amount of the second solvent in a periphery of the ink layer is greater than the amount of the second solvent in a middle portion of the ink layer.

Specifically, materials of the first solvent 13 and the second solvent 14 are same.

Specifically, the second solvent 14 can be printed on the first solvent 13 having the solute 5 in the entire display area 15. Furthermore, an amount of the second solvent 14 continuously increases in a direction from a middle portion of the ink layer 4 to a periphery of the ink layer 4. Of course, the second solvent 14 can also be printed on the first solvent 13 with the solute 5 in a portion of the display area 15, for example, the ink layer 4 includes the middle area 12 without the second solvent 14 printed thereon, and an amount of the second solvent 14 continuously increases in the direction from the middle area 12 to the periphery of the ink layer 4.

In the present embodiment, the ink layer 4 is formed by two inkjet printing processes. To form the functional layer 2 having uniform thickness, during the first inkjet printing process, an amount of the solute 5 printed on different positions of the display area 15 of the substrate 3 is same, and an amount of the first solvent 13 in different positions is same as well. Because different positions of the substrate 3 have different volatilization rates of the solvent 6 during a vacuum drying process (a volatilization rate of the solvent 6 in the periphery of the display area 15 is greater than a volatilization rate of the solvent 6 in the middle portion of the display area 15), the solute 5 is easily evaporated along with the solvent 6 in the periphery, thereby resulting in the functional layer 2 with non-uniform thickness (the middle portion is thicker than the periphery) and severely affecting effectiveness of the display panel 1. Therefore, after the first inkjet printing process, the second solvent 14 is further printed on the first solvent 13 having the solute 5 to form the ink layer 4. Moreover, a total amount of the solvent 6 in the periphery of the ink layer 4 is greater than a total amount of the solvent 6 in the middle portion of the ink layer 4. As a result, a concentration of gas solvent above the entire display area 15 of the substrate 3 can be roughly even when the solvent 6 in the ink layer 4 of the display area 15 is evaporated, and the volatilization rate of the solvent 6 in the entire ink layer 4 of the substrate 3 can be roughly even as well, thereby preventing a situation in which too much solute 5 is evaporated due to an overly high volatilization rate of the solvent 6 in the periphery of the ink layer 4. Consequently, the functional layer 2 with uniform thickness can be formed by the present embodiment. In addition, in a situation that the concentration of the gas solvent above the entire display area 15 of the substrate 3 is roughly even, a virtual pixel layer that cannot display does not need to be disposed around the display area. As a result, not only the functional layer 2 with uniform thickness but also the display panel 1 with a narrow frame can be realized.

An embodiment of the present disclosure further provides a method of manufacturing a functional layer of a display panel. Different from the above embodiments, in the present embodiment, the functional layer 2 is a luminescent layer, and the solute 5 in the ink layer 4 includes a red luminescent material, a green luminescent material, and a blue luminescent material, which are separately printed in different sub-pixel areas 7.

Specifically, the sub-pixel area printed with the red luminescent material is a red sub-pixel area, the sub-pixel area printed with the green luminescent material is a green sub-pixel area, and the sub-pixel area printed with the blue luminescent material is a blue sub-pixel area, wherein a bottom area of the blue sub-pixel area is greater than bottom areas of the red sub-pixel area and the green sub-pixel area. Luminescent layers formed in the above three sub-pixel areas have different volumes, but have same heights. That is, a total amount of the luminescent material (solute) in different sub-pixel areas is different, but an amount of the luminescent material per unit area is same.

Figure 7:
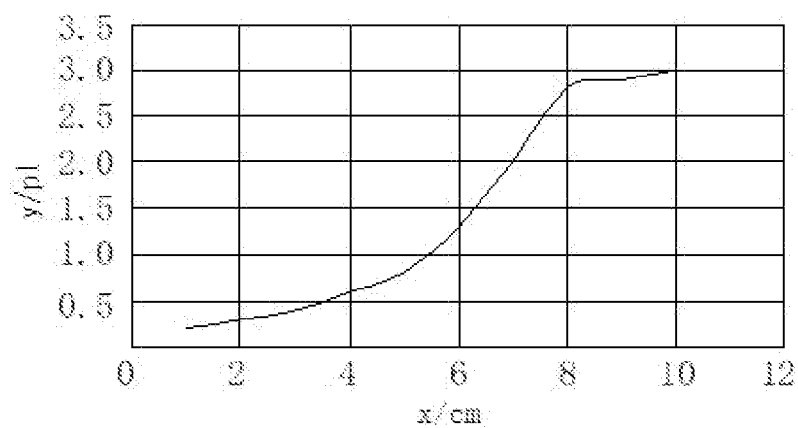
FIG. 7 is a curve diagram showing a relationship between an amount of a second solvent printed in a blue sub-pixel area and a distance between the sub-pixel area and a middle portion of a display area according to an embodiment of the present disclosure.

Specifically, an amount of the second solvent 14 that needs to be printed in the sub-pixel areas 7 in different positions of the display area 15 can be obtained by computer simulation. Take a G4.5H (460×730) display panel as an example, an amount of the second solvent 14 that needs to be printed in a blue sub-pixel area in different positions of the display area is obtained by computer simulation. A given size of the display area 15 is 10 inches. During the first inkjet printing process, a total amount of the solute 5 (blue luminescent material) printed in the blue sub-pixel area and the first solvent 13 is 10.5 pl (1 pl=$10^{-9}$ ml), wherein the solute 5 includes 20% of a total content (an amount of the first solvent 13 is 8.4 pl, and an amount of the solute 5 is 2.1 pl), and a curve diagram showing a relationship between the amount (y) of the second solvent 14 printed in the blue sub-pixel area of the display area 15 and a distance (x) between the blue sub-pixel area and the middle portion of the display area 15 can be obtained by computer simulation. As shown in FIG. 7, when distances x between the blue sub-pixel area and the middle portion of the display area 15 are 2 cm, 4 cm, 6 cm, and 8 cm, amounts y of the second solvent 14 that need to be printed in the blue sub-pixel area are respectively about 0.3 pl, 0.6 pl, 1.3 pl, and 2.8 pl.

Specifically, materials of the first solvent 13 and the second solvent 14 include propylene glycol methyl ether acetate or diethylene glycol methyl ether.

If each of the sub-pixel areas has same amount of a solute per unit area and same amount of a solvent per unit area, this will easily cause a thickness of a luminescent layer to be non-uniform (a middle portion is thicker than a periphery) after a printing process because a volatilization rate of the solvent in different positions of a substrate is different during a vacuum drying process (a volatilization rate of the solvent in the periphery of the display area is faster than that in the middle portion of the display area), thereby severely affecting effectiveness of a display panel. In the present embodiment, after the first solvent 13 having the red luminescent material, the green luminescent material, and the blue luminescent material is printed, the second solvent 14 is further printed on the first solvent 13, thereby ensuring that the amount of the solvent per unit area of each of the sub-pixel areas is same. Furthermore, an amount of the solvent per unit area of the sub-pixel areas in the periphery of the display area 15 is greater than an amount of the solvent per unit area of the sub-pixel areas in the middle portion of the display area 15. Therefore, the volatilization rate of the solvent in the periphery of the display area 15 and the volatilization rate of the solvent in the middle portion of the display area are same, thereby forming a luminescent layer with uniform thickness in the entire display area 15.

Figure 4:
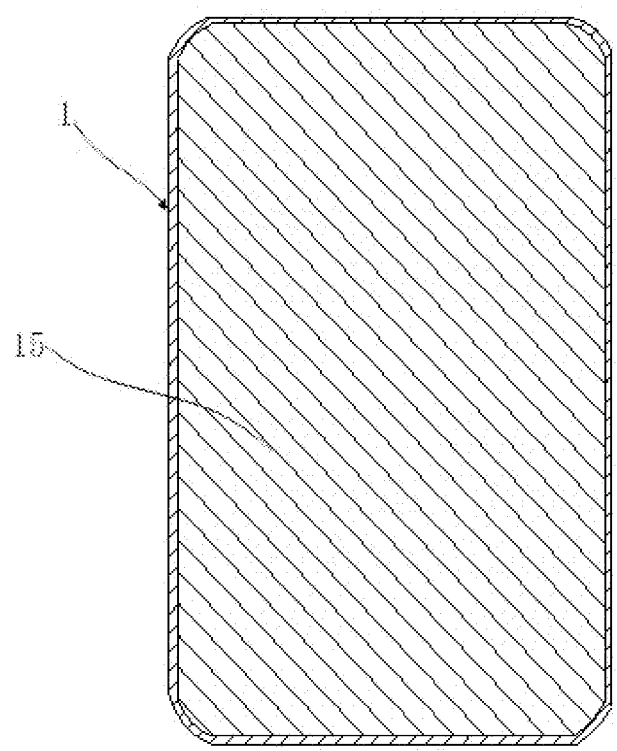
FIG. 4 is a schematic view showing a display panel according to an embodiment of the present disclosure.

As shown in FIG. 3 and FIG. 4, an embodiment of the present disclosure provides a method of manufacturing a display panel, including following steps:
providing a substrate 3; and
forming the plurality of functional layers 2 stacked on the substrate 3 by the above method of manufacturing the functional layer 2 of the display panel 1, wherein the functional layers 2 include a hole injection layer, and a hole transport layer or a luminescent layer which are sequentially disposed on the hole injection layer.

Specifically, as shown in FIG. 3, the display panel 1 includes the substrate 3. The substrate 3 includes a base plate 8, a thin film transistor (TFT) array layer 9 disposed on the base plate 8, a plurality of anodes 10 spaced apart from each other on the TFT array layer 9, and a plurality of pixel defining layers 11 spaced apart from each other on the TFT array layer 9. The anodes 10 are disposed in the display area 15, and the pixel defining layers 11 are disposed around the anodes 10 to form the sub-pixel areas 7. The functional layers 2 are formed on the anodes 10 in pixel openings.

In the present embodiment, in the display area 15 of the substrate 3 of the display panel 1, an amount of the solute 5 in different positions of the ink layer 4 formed by inkjet printing is same. Furthermore, an amount of the solvent 6 in a periphery of the ink layer 4 is greater than an amount of the solvent 6 in a middle portion of the ink layer 4. Therefore, when the solvent 6 in the ink layer 4 in the display area 15 is evaporated, a concentration of a gas solvent above the entire display area 15 of the substrate 3 is roughly even so that a volatilization rate of the solvent 6 in the entire ink layer 4 in the substrate 3 is roughly even. Moreover, a situation in which the solute 5 dissolved in the solvent 6 is evaporated due to an overly high volatilization rate of the solvent 6 in the periphery of the ink layer 4 is prevented, and the functional layers 2 having uniform thicknesses can be formed, thereby ensuring luminescent efficiency and lifetime of the display panel 1. In addition, in a situation that the concentration of the gas solvent above the entire display area 15 of the substrate 3 is roughly even, a virtual pixel layer that cannot display does not need to be disposed around the display area 15. As a result, not only the functional layers with uniform thicknesses but also the display panel 1 having a narrow frame can be realized.

To sum up, the present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. A method of manufacturing a functional layer of a display panel having a substrate, comprising following steps:
forming an ink layer on a display area of the substrate by inkjet printing, wherein the ink layer comprises a solute and a solvent configured to dissolve the solute, different positions of the ink layer have same amount of the solute, and an amount of the solvent in a periphery of the ink layer is greater than an amount of the solvent in a middle portion of the ink layer; and
evaporating the solvent in the ink layer to form the functional layer with uniform thickness.

2. The method of claim 1, wherein an amount of the solvent continuously increases in a direction from the middle portion of the ink layer to the periphery of the ink layer.

3. The method of claim 1, wherein the ink layer comprises a middle area, different positions of the middle area have same amount of the solute, and an amount of the solvent continuously increases in a direction from the middle area to the periphery of the ink layer.

4. The method of claim 1, wherein the solvent comprises a first solvent and a second solvent; and
the step of forming the ink layer on the display area of the substrate by inkjet printing comprises following steps:
printing the first solvent having the solute on the display area of the substrate by inkjet printing; and
printing the second solvent on the first solvent having the solute by inkjet printing to form the ink layer, wherein different positions of the ink layer have same amount of the first solvent, and an amount of the second solvent in the periphery of the ink layer is greater than an amount of the second solvent in the middle portion of the ink layer.

5. The method of claim 4, wherein a material of the first solvent and a material of the second solvent are same.

6. The method of claim 4, wherein an amount of the second solvent continuously increases in a direction from the middle portion of the ink layer to the periphery of the ink layer.

7. The method of claim 4, wherein the ink layer comprises a middle area, and an amount of the second solvent continuously increases in a direction from the middle area to the periphery of the ink layer.

8. The method of claim 1, wherein the functional layer comprises a hole injection layer, a hole transport layer, or a luminescent layer.

9. The method of claim 1, wherein the display area of the substrate comprises a plurality of sub-pixel areas arranged in an array, the ink layer is formed in the sub-pixel areas, the sub-pixel areas have same amount of the solute per unit area, and an amount of the solute per unit area of the sub-pixel areas near a periphery of the display area is greater than an amount of the solute per unit area of the sub-pixel areas near a middle portion of the display area.

10. The method of claim 9, wherein the substrate comprises a base plate, a thin film transistor (TFT) array layer disposed on the base plate, a plurality of anodes spaced apart from each other on the TFT array layer, and a pixel defining layer disposed around the anodes; and wherein the anodes are disposed in the display area, and the pixel defining layer is disposed around the anodes to form the sub-pixel areas.

11. The method of claim 9, wherein the sub-pixel areas comprise a red sub-pixel area, a green sub-pixel area, and a blue sub-pixel area.

12. A method of manufacturing a functional layer of a display panel having a substrate, comprising following steps:

printing a first solvent having a solute on a display area of the substrate by inkjet printing;

printing a second solvent on the first solvent having the solute by inkjet printing to form an ink layer, wherein different positions of the ink layer have same amount of the first solvent, and an amount of the second solvent in a periphery of the ink layer is greater than an amount of the second solvent in a middle portion of the ink layer; and evaporating the first solvent and the second solvent in the ink layer to form the functional layer with uniform thickness.

13. A method of manufacturing a display panel, comprising following steps:

providing a substrate; and forming a plurality of functional layers stacked on the substrate by the method of manufacturing the functional layer of the display panel according to claim 1, wherein the functional layers comprise a hole injection layer, a hole transport layer, or a luminescent layer.

14. The method of claim 13, wherein an amount of the solvent continuously increases in a direction from the middle portion of the ink layer to the periphery of the ink layer.

15. The method of claim 13, wherein the ink layer comprises a middle area, different positions of the middle area have same amount of the solute, and an amount of the solvent continuously increases in a direction from the middle area to the periphery of the ink layer.

16. The method of claim 13, wherein the display area of the substrate comprises a plurality of sub-pixel areas arranged in an array, and the functional layers are formed in each of the sub-pixel areas.

17. The method of claim 16, wherein the substrate comprises a base plate, a thin film transistor (TFT) array layer disposed on the base plate, a plurality of anodes spaced apart from each other on the TFT array layer, and a pixel defining layer disposed around the anodes; and wherein the anodes are disposed in the display area, and the pixel defining layer is disposed around the anodes to form the sub-pixel areas.

* * * * *